United States Patent
Chen et al.

(10) Patent No.: US 9,030,344 B2
(45) Date of Patent: May 12, 2015

(54) SYSTEM AND METHOD FOR INTEGRATION OF HYBRID PIPELINE

(71) Applicant: Broadcom Corporation, Irvine, CA (US)

(72) Inventors: Chun-Ying Chen, Irvine, CA (US); Wei-Ta Shih, Irvine, CA (US); Rong Wu, Irvine, CA (US); Young Shin, Irvine, CA (US); Karthik Raviprakash, Irvine, CA (US); Tao Wang, Costa Mesa, CA (US); Chia-Jen Hsu, Irvine, CA (US); Tianwei Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/021,735

(22) Filed: Sep. 9, 2013

(65) Prior Publication Data
US 2015/0009059 A1    Jan. 8, 2015

Related U.S. Application Data

(60) Provisional application No. 61/843,569, filed on Jul. 8, 2013.

(51) Int. Cl.
*H03M 1/12* (2006.01)
*H03M 1/00* (2006.01)
*H03M 1/06* (2006.01)

(52) U.S. Cl.
CPC . *H03M 1/12* (2013.01); *H03M 1/00* (2013.01); *H03M 1/0695* (2013.01)

(58) Field of Classification Search
CPC ........ H03M 1/12; H03M 1/00; H03M 1/0695
USPC .................. 341/155, 156, 120, 118, 162, 161
See application file for complete search history.

(56) References Cited

U.S. PATENT DOCUMENTS 6,567,029 B2 *  5/2003  Krymski et al. ............. 341/155
8,614,638 B1 * 12/2013  Limotyrakis et al. ........ 341/161

OTHER PUBLICATIONS

Lee, C., et al., A SAR-Assisted Two-Stage Pipeline ADC, IEEE Journal of Solid-State Circuits, vol. 46, No. 4, Apr. 2011, 11 pages.

* cited by examiner

*Primary Examiner* — Joseph Lauture
(74) *Attorney, Agent, or Firm* — Brinks Gilson & Lione

(57) ABSTRACT

A system includes a pipeline analog-to-digital converter as a first stage to process an input signal, and a successive approximation register (SAR) analog-to-digital converter as a second stage to process the input signal. The SAR analog-to-digital converter includes a power adjustment element to adjust a reference voltage of the SAR analog-to-digital converter to match a full scale voltage of the pipeline-analog-to-digital converter.

20 Claims, 5 Drawing Sheets

SYSTEM AND METHOD FOR INTEGRATION OF HYBRID PIPELINE

PRIORITY CLAIM

This application claims priority to U.S. Provisional Application Ser. No. 61/843,569, filed Jul. 8, 2013, which is incorporated herein by reference in its entirety.

TECHNICAL FIELD

This disclosure relates generally to signal sampling systems and methods. It also relates to a hybrid analog-to-digital receiver to reduce power consumption during signal conversion.

BACKGROUND

An analog-to-digital converter (ADC) includes an electronic device that receives an analog signal. The analog-to-digital converter samples the received signal and outputs a signal representing a digital value. The digital value may be acquired in operations whose outputs represent a number of bits. The ADC may be used to sample a variety of analog waveforms in the form of radio-frequency wave, sound waves, or voltage signal.

BRIEF DESCRIPTION OF THE DRAWINGS

The innovation may be better understood with reference to the following drawings and description. In the figures, like reference numerals can designate corresponding parts throughout the different views.

DETAILED DESCRIPTION

An analog-to-digital converter (ADC) may operate to sample analog waveforms to produce digital representations. Pipeline ADC architectures can achieve high-speed and high resolution. Pipeline ADCs rely on signal processing that may include a number of gain stages and signal slewing. This signal processing can increase the power usage of pipeline ADCs. In addition, power losses may also be incurred while addressing noise issues within pipeline ADCs.

Successive-approximation-register (SAR) ADCs use a binary search algorithm to identify the sampled voltage/amplitude range. The SAR ADC may operate without similar signal processing to that of pipeline ADCs. As a consequence, SAR ADCs may operate with more modest power usage than pipeline ADCs. The successive execution of the binary search may result in a reduced cycling speed. This in turn may lead to comparatively low sampling rates and/or low resolution. In addition, the resolution limits of SAR ADCs may lead to difficulty in producing dynamic ranges (and bit-depths) similar to those of pipeline ADCs. The bit-depth of a SAR ADC may be increased by using a two-stage SAR ADC setup with a gain element in between the stages.

Figure 1:
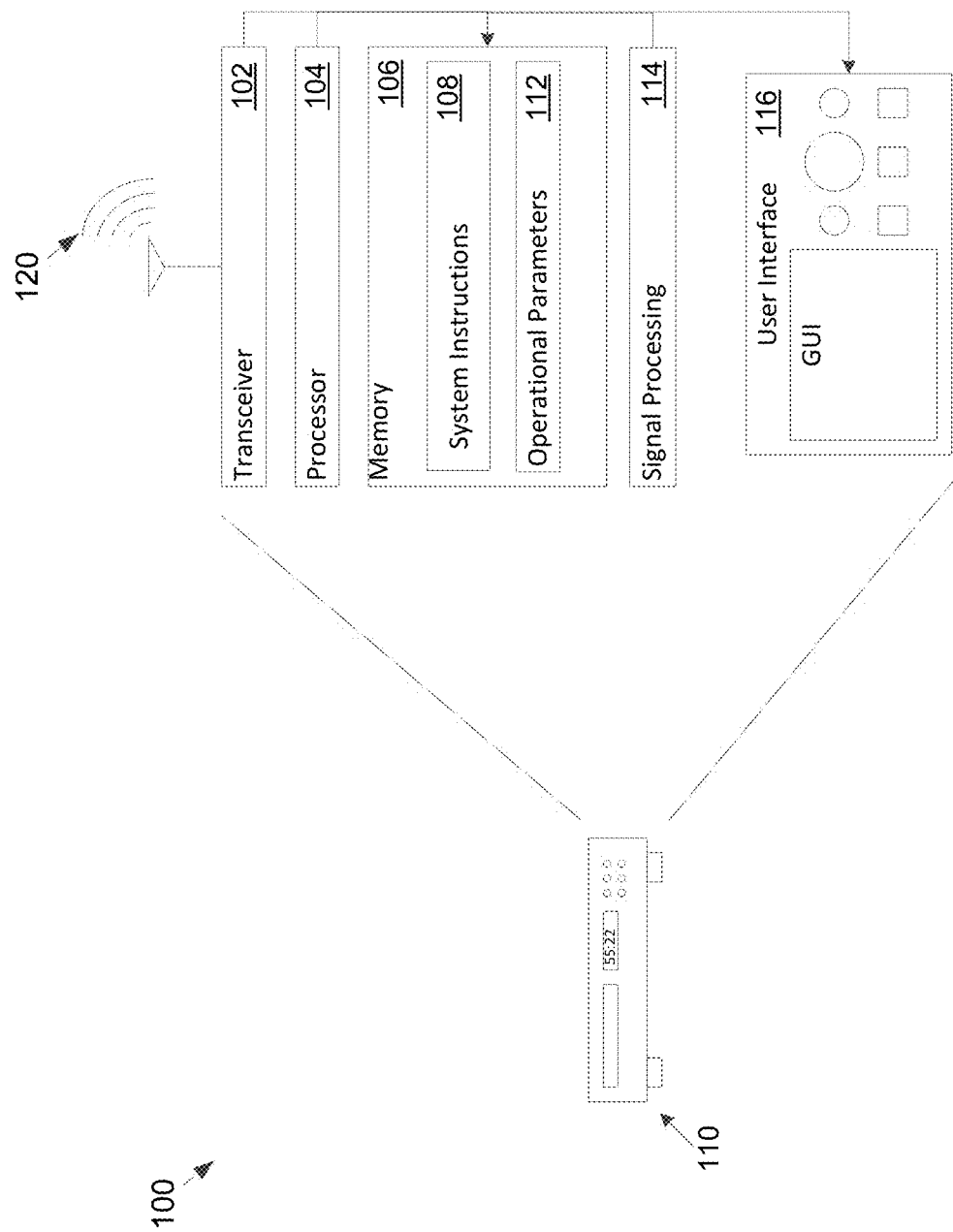
FIG. 1 is a block diagram of an exemplary sampling system environment.

FIG. 1 is a block diagram of an exemplary sampling system environment. In this sampling system environment 100, an RF device 110 receives an analog waveform 120, which is sampled to produce a digital representation of the waveform. In one example, the RF device is a communication device, such as a cell phone, smartphone, tablet, laptop, or a portable gaming system. However, the RF device may be virtually any device implementing analog-to-digital (A2D) conversion of a signal. For example, cable or satellite television set-top boxes (STBs), network interface cards (NICs), or modems may use such conversion capabilities. The waveform may be sent in the form of a wireless communication (i.e. a signal encoded onto a free-space electromagnetic field) or sent over a wireline connection.

The RF device 110 may include transceiver elements 102 to support RF communication, one or more processors 104 to support execution of applications and general operation of the device. The device may include memory 106 for execution support and storage of system instructions 108 and operation parameters 112. Signal processing hardware 114 (e.g. ADC, baseband processors etc.) may also be included to support decoding/encoding RF signaling. The communication device may include a user interface 116 to allow for user operation of the RF device.

To support high-speed signaling among such RF devices, a high-sampling rate high-resolution ADC may be used. Further, a high-performance low-power system may offer significant cost savings and device performance due to reduced power consumption. A hybrid pipeline and SAR architecture may provide high performance in conjunction with power savings.

Figure 2:
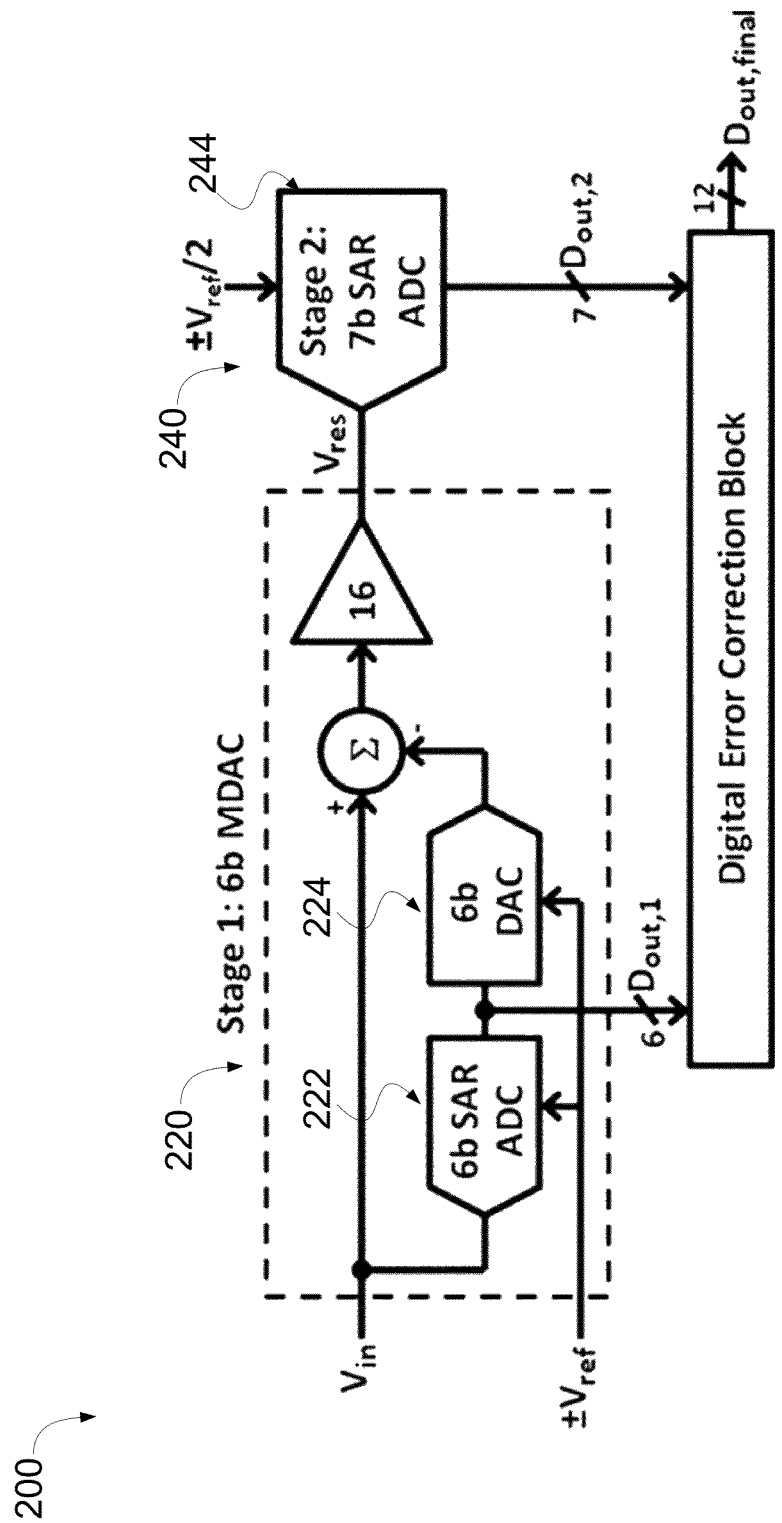
FIG. 2 is a circuit diagram of an exemplary two-stage SAR ADC.

FIG. 2 is a circuit diagram of an exemplary two-stage SAR ADC. In this exemplary two-stage SAR ADC 200, A 6-bit SAR ADC 222 is used in the first stage 220 to measure the six most significant bits (MSBs) for the input waveform $V_{in}$. The six MSBs are then passed through a 6-bit digital-to-analog converter (DAC) 224 to reconstruct the measured portion $V_{in}$. The measured portion is subtracted from $V_{in}$ to form a residual ($V_{res}$). The residual is then passed through a 7-bit SAR ADC 242 in the second stage 240 to measure the next seven least significant bits (LSBs). The two-stage SAR ADC 200 achieves an effective 12-bit measurement (one bit is dedicated to mitigating differential errors between the two SAR ADC stages. The system also may have roughly double the cycling period of individual stages because the two SAR stages occur in succession. The increased cycling period may limit the maximum cycling frequency of the two-stage SAR ADC.

Figure 3:
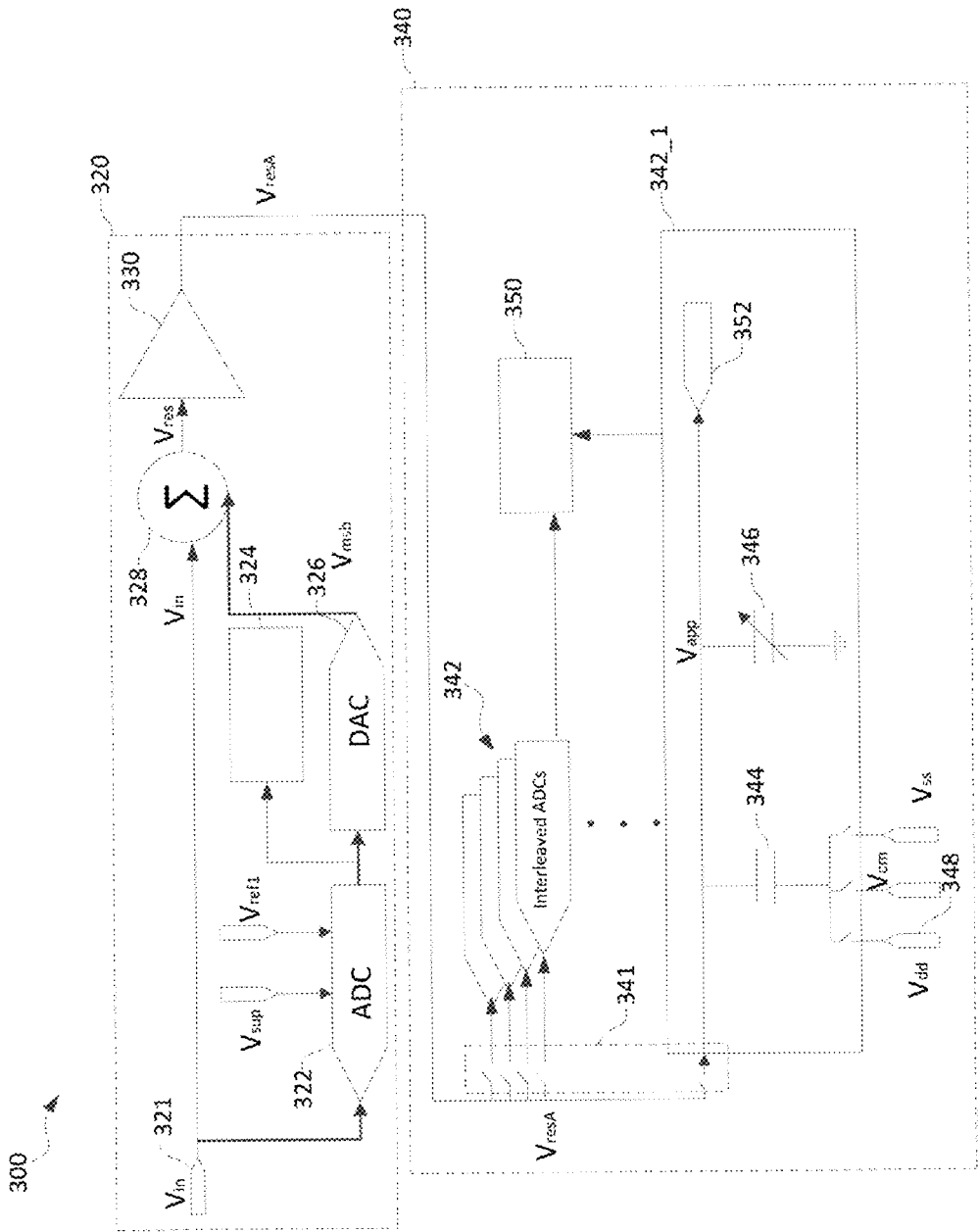
FIG. 3 is a circuit diagram of an exemplary hybrid pipeline—SAR ADC.

FIG. 3 is a circuit diagram of an exemplary hybrid pipeline—SAR ADC. An incoming signal ($V_{in}$) is received at the input 321 of the ADC. The incoming signal is passed through the Pipeline ADC stage 320 for determination of the MSB(s) of the digital representation.

$V_{in}$ may be sampled and held at input to ensure that successive components of the hybrid ADC act on the same portion of the $V_{in}$. In an exemplary case of a cyclic ADC system, $V_{in}$ may be sampled a particular level at the start of the cycle. $V_{in}$ is then held at the particular level until determinations are complete for the cycle. In other systems, signals may be sampled and held for multiple cycles and/or sampled and held for portions of a cycle.

The incoming signal may be passed through an ADC element 322 for sampling. The ADC element may determine the MSB(s) of a digital representation of Vin. For example, the ADC element 322 may determine the three MSBs for the digital representation. Other numbers of MSBs may be determined by the ADC element 322. For example, one, two or four MSBs may be determined.

In some systems, the effective number of bits determined by an ADC may not be an integer number. For example, an ADC may produce 2.5 effective bits. In an exemplary system, portions of bits are used in error correction/mitigation schemes. Thus, the integer bits may be applied to measurement of the signal and the remaining portion of a bit may be used to remove artifacts from the integer measurement bits. Alternatively or additionally, the portion of a bit may be used to reference the integer bit to another parallel or series bit determination. It will be readily appreciated that whole or integer bits may also be applied to such error correction schemes. Bits applied to error correction rather than measurement may not be counted as significant bits. For example, if a system determining MSBs determines 2.5 effective bits and applies 0.5 effective bits to error correction, the system then has determined two MSBs.

The ADC element 322 may include converters such as flash ADCs, SAR ADCs, sigma-delta ADCs, dual-slope ADCs, and/or other converter technologies. Further, the ADC element may be implemented using various fabrication techniques such as complementary metal-oxide semiconductor (CMOS), bipolar silicon technologies, or III-V type fabrication.

The ADC element 322 may be supplied with a reference signal $V_{ref1}$. The reference signal may be used by the ADC element 322 to determine appropriate bit levels. The scale of measurement may be determined based on $V_{ref1}$. The reference signal may affect power consumption of the ADC element. Selection of the reference signal may increase or decrease the power consumption of the ADC element 322. The magnitude and sign of the effect may be determined by the type and parameters of the ADC element 322. Some systems may have constraints on what constitutes an acceptable reference signal level depending on the ADC architectures and power supply voltages. The range of acceptable reference signals may vary with ADC element 322 type. The operational parameters of the ADC element in addition to a supply signal $V_{sup}$ may determine the scale of measurement without the supply of a specific reference signal to establish the scale. For example, the ADC element may be supplied with a signal level of $V_{sup}$, and this supplied signal $V_{sup}$ may establish an measurement scale equivalent to $V_{ref1}$ without a signal of $V_{ref1}$ being provided to the system.

The output of the ADC may be provided to ADC logic 324 for processing of the extracted MSBs. Such processing logic may include digital signal processors, general purpose processors (e.g. RISC, CISC, etc.), application specific integrated circuits (ASIC), microcontrollers, field-programmable gating arrays (FPGAs), and/or other processing elements. The ADC logic 324 may receive the output of the ADC element, perform error correction, and/or concatenate the output bits with bit determinations done by other portions of the system.

The output of the ADC element may also be passed to a DAC system 326 for reconstruction of the measured portion $V_{msb}$. The DAC system may include various DAC types, such as, binary-weighted DACs, R-2R ladder DACs, oversampling DACs, pulse-width modulators, thermometers-coded DACs, hybrid DACs, and/or other DAC types. The DAC system generates a signal $V_{msb}$ that is functionally equivalent to the portion of $V_{in}$ measured by the ADC element. It will be readily appreciated that an output of the ADC logic 324 may also be provided as input to the DAC system 326.

The DAC system output ($V_{msb}$) is provided to one input of a subtracting block 328. Another input of the subtracting block is provided with the incoming signal $V_{in}$. The subtracting block generates an output that represents the measured portion $V_{msb}$ subtracted from the incoming signal $V_{in}$. Thus, a residual unmeasured portion $V_{res}$ is generated.

The residual signal $V_{res}$ may be passed through an amplifier 330 to produce an amplified residual $V_{resA}$. The amplifier may be proportional to the number of MSBs generated in the pipeline ADC stage 320. For example, if two MSBs were generated in the pipeline ADC stage the amplifier may amplify $V_{res}$ by a factor of four. Such a proportional amplification level may result in a signal level of $V_{resA}$ similar to that of $V_{in}$. This may assist in ensuring that the signal being measured by the system is with the effective measurement range of the hybrid ADC 300 components. In some implementations, such signal level management may be achieved without amplification proportional to the MSBs. For example, the amplifier may include signal level measurement components and logic such that the signal is amplified to predetermined average signal level. The level of amplification is then output to error correction logic which may adjust measurements occurring after amplification based on the amplification level.

In the second stage 340 of the hybrid ADC 300, an interleaved set of ADCs 342 are used to generate a measurement of the LSBs from the amplified residual signal $V_{resA}$. The interleaved ADCs may allow for a high speed measurement of the LSBs, because of their parallel bit-determination structure. In addition, the incoming signal is sampled and held. Such sampling and holding may relax timing constraints among the interleaved ADCs. For example, for a dynamic signal measurement, signal slewing may be used ensure proper signal timing. For a static signal (e.g. a held signal), such slewing may be omitted because the signal is the same for times within the hold cycle. Power saving may be achieved by omitting components designed to achieve complex timing for a dynamic signal.

The interleaved ADCs 342 may operate using a supply signal $V_{ss}$ and a reference signal $V_{dd}$. To ensure matching between the stages of the hybrid ADC 300, the reference signal $V_{dd}$ may be selected to match the reference signal $V_{ref1}$ of the pipeline stage 320. Differing ADC types may have differing operation for a given reference level. In some cases, the full range of a scale associated with a given reference signal level may lead to improper and/or degraded ADC operation. For example, a large reference signal may lead to scales in which non-linearities may occur in an ADC (e.g. at the extrema of the full range of the scale). Further, to ensure proper interleaved ADC operation, the same reference signal level may be used with the various interleaved ADCs.

Sampling switches 341 may be situated between the ADC stages. The sampling switches may be used to facilitate the operating mode of the interleaved ADC. In various implementations, interleaved ADCs 342 may have a sampling mode in which one or more of sampling switches 341 may be closed. Interleaved ADCs 342 may have a measurement mode in which one or more of sampling switches 341 may be open. In various implementations, interleaved ADCs 342 may individually enter/exit sampling or measurement modes. In some cases, inter ADCs 342 may enter/exit sampling or measurement modes in a group. In some implementations, the mode of interleaved ADCs may be controlled via controlling logic 350.

A set of capacitors 344, 346 to allow for usage of a matched reference signal while adjusting the applied reference signal level $V_{app}$ such that scale is appropriate for the ADC type. Capacitor 344 may be situated between the reference signal source 348 and the detection portion 352 of the interleaved ADC 342_1. Capacitor 346 may be situated in parallel with the detection portion 352 of interleaved ADC 342_1. The other port of Capacitor 346 may be grounded. The ratio of capacitors 344 and 346 may be used to control $V_{app}$. Capacitor 344 may be selected for favorable system operation. For example, in a SAR ADC the capacitor 344 may be used in a capacitive digital-to-analog converter (CDAC) scheme. Smaller values for capacitor 344 may decrease the system settling time and gain mismatch and may increase system speed. For example, the settling time may be reduced by adjusting the RC time constant of the hybrid ADC system, and capacitor 344 affects the RC time constant. Capacitor 346 may be selected based on signal full-scale level matching between first stage ADC (320) and second-stage ADC (340) based on the selected value of capacitor 344. In some cases, capacitor 346 may be implemented as a programmable capacitor. In addition, capacitor 346 may be selected to account for internal capacitance of the interleaved ADCs and/or their controlling logic 350.

In some implementations, a common mode ($V_{cm}$) of the differential signals may be supplied. $V_{cm}$ may be used in determination of bit values. For example, $V_{cm}$ may be associated with a zero or negative bit determination.

The value of programmable capacitor 346 may be selected based on an active calibration loop. The loop may run one time, run once every cycle of the hybrid ADC 300, and/or may run once every given number of cycles of the hybrid ADC system. Alternatively or additionally, the calibration loop may be initiated aperiodically by an operator or automated systems (e.g. a sensor network). In some cases, the calibration may account for variations (or other transient components) in one or more conditions. For example, conditions may include signal level, temperature, cycle duration, etc. for the hybrid ADC system. Additionally or alternatively, the calibration may account for static error sources.

The programmable capacitor may also be implemented in non-hybrid systems. For example, a programmable capacitor situated in parallel with single-stage ADC system may be used to adjust the scale of the system. This may support increased system flexibility.

Figure 4:
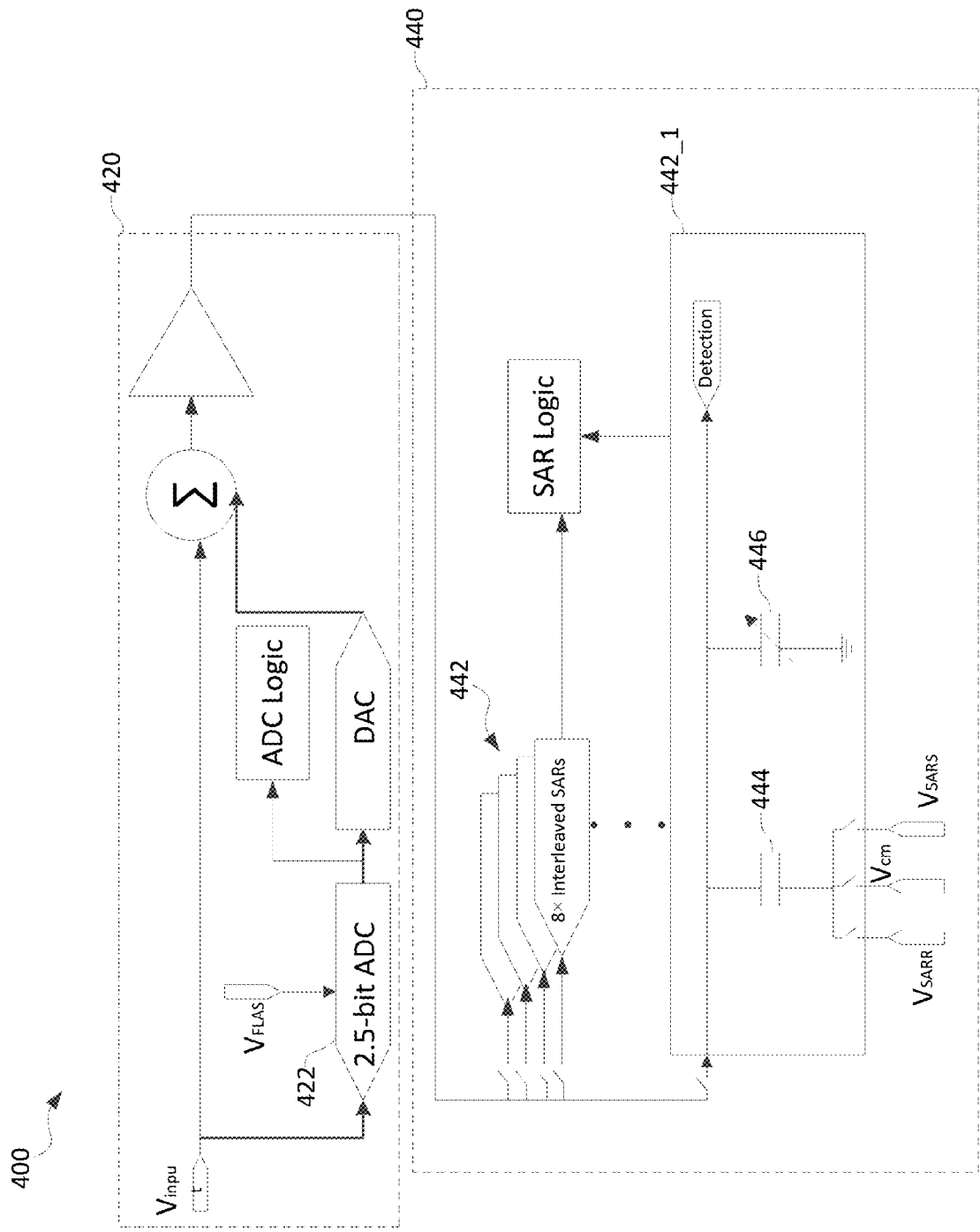
FIG. 4 is a circuit diagram of an exemplary two-stage hybrid flash—SAR ADC.

FIG. 4 is a circuit diagram of an exemplary two-stage hybrid flash—SAR ADC. In this exemplary system 400, the interleaved ADCs 442 may include SAR ADCs. SAR ADCs may determine LSBs. The SAR ADCs may operate at a high sampling speed because the SARs are running at different phases and are interleaved in time domain. For example, eight interleaved SAR ADCs 442 may be used to achieve a determination of eight LSBs. The ADC element 422 includes a flash ADC that generates 2.5 effective bits. In this case two bits are used as the MSBs of the determination, and the remaining half bit is used to mitigate errors in matching between the stages.

The exemplary interleaved SAR ADC stage may be operated at a low supply signal level $V_{SARS}$ to achieve power savings. For example, the SAR ADC system may be configured for operation at a supply signal level of 1V. In some cases, the reference level $V_{SARR}$ may be selected at a level inappropriate for reference matching. In this example, the flash ADC in the first stage uses a supply level $V_{FLAS}$ of 1.8V with a reference voltage of 0.7V. To achieve proper matching, in this example, a $V_{SARR}$ of 1V may be selected for the interleaved SAR ADCs 442. In this case, the eight interleaved SAR ADCs may operate with the same $V_{SARR}$. $V_{SARR}$ may not match the reference voltage of the flash ADC (0.7V). In some cases, $V_{SARR}$ may be attenuated. The exemplary structure of interleaved SAR ADC 442_1 is depicted. Capacitor 444 may be selected to be <30 fF to account for noise and allow for high system cycling speed. Further, this value may reduce the power consumption of the first stage. Capacitor 446 is programmable and is calibrated to adjust $V_{SARR}$ to an applied level $V_{SARA}$ of ~0.7V at the detection point (node between 444 and 446).

Figure 5:
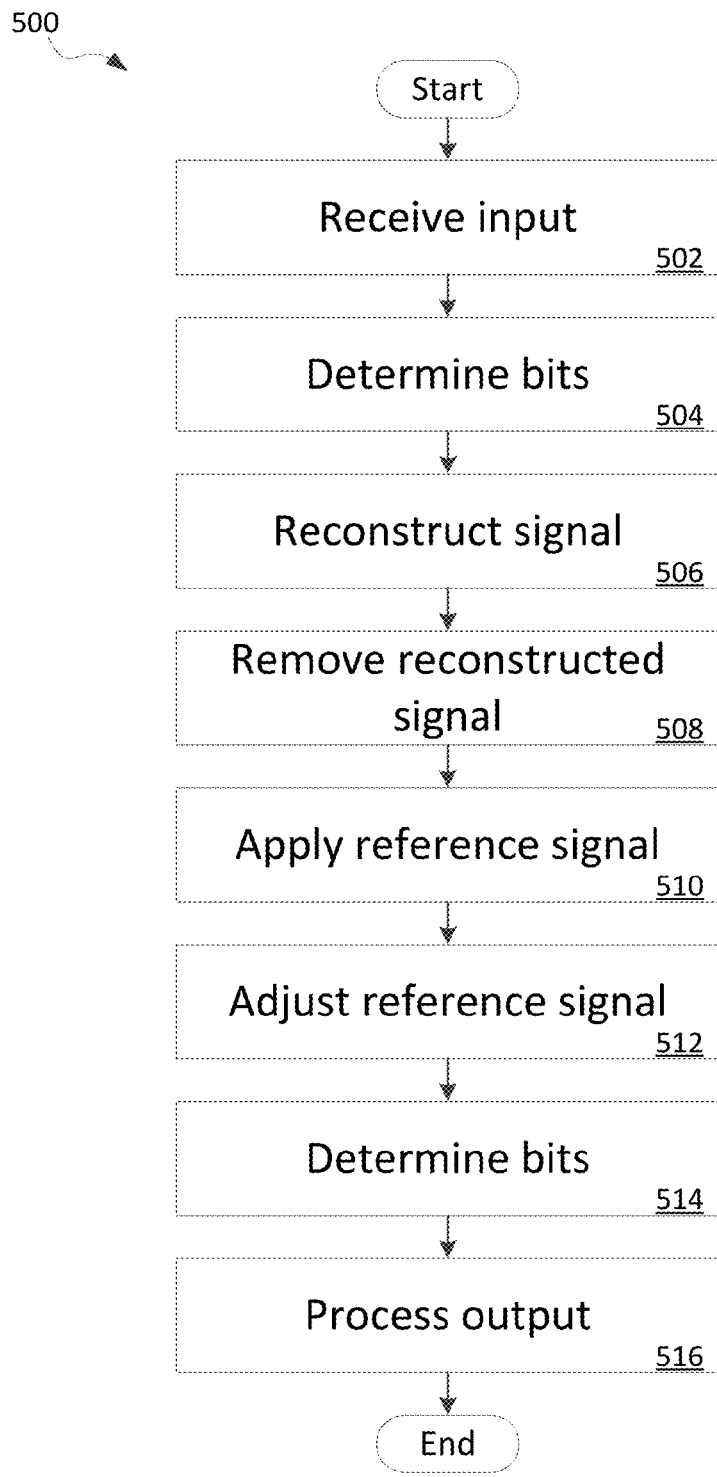
FIG. 5 is a logical flow diagram of an exemplary method for hybrid analog-to-digital conversion.

FIG. 5 is a logical flow diagram of an exemplary method for hybrid analog-to-digital conversion. An input signal is received at a first stage of a hybrid ADC (502).

At the first stage of the hybrid ADC, an ADC element determines the MSBs for a digital representation of the input signal (504). The ADC element may determine bits or portions of bits beyond those used as the MSBs. These excess bits of bit portions may be used in error correction schemes.

The MSBs are received by a DAC of the first stage and are used to reconstruct the portion of the input signal represented by the MSBs (506). The reconstructed portion is removed from input signal to form a residual signal (508). The residual signal is passed to the second stage of the hybrid ADC. The residual signal may be amplified during transition from the first to the second stages of the hybrid ADC.

A reference signal is applied to a set of interleaved ADC elements in the second stage of the hybrid ADC (510). The reference signal is used to match the scales of the first and second stages of the hybrid ADC.

The reference signal may be adjusted via a power adjustment element (e.g. a capacitor pair) in a matching circuit. Power adjustment may include attenuation and/or amplification in a calibration (analog or digital) system to ensure proper operation of interleaved ADC elements (512). The adjustment may be facilitated via a programmable power adjustment element.

The interleaved ADC elements determine the LSBs of the digital representation of the input signal using the residual signal passed from the first stage (514). The MSBs determine via the first stage and LSBs determined via the second stage are processed to produce the digital representation of the input signal (516). The processing may include error correction and signal level matching.

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium. Thus, a product, such as a computer program product, may include a storage medium and computer readable instructions stored on the medium, which when executed in an endpoint, computer system, or other device, cause the device to perform operations according to any of the description above.

While various implementations have been described, many more embodiments and implementations are possible. Accordingly, the description is not to be restricted.

What is claimed is:

1. A method, comprising:
responsive to a capacitance ratio, adjusting a successive approximation register (SAR) reference voltage of a SAR analog-to-digital converter to attempt to match a scale voltage of a pipeline analog-to-digital converter;

processing a most-significant bit of an input signal with the pipeline analog-to-digital converter; and processing a least-significant bit of an input signal with the SAR analog-to-digital converter.

2. The method of claim 1, wherein the capacitance ratio comprises a ratio of capacitance associated with a first capacitor and a second capacitor.

3. The method of claim 2, wherein the first capacitor is situated in parallel with the SAR analog-to-digital converter and the first capacitor is situated in series with the second capacitor.

4. The method of claim 1, further comprising outputting a sampled version of the input signal from the pipeline analog-to-digital converter to the SAR analog-to-digital converter.

5. The method of claim 1, wherein the SAR analog-to-digital converter comprises multiple interleaved SAR analog-to-digital converters.

6. The method of claim 5, wherein the multiple interleaved SAR analog-to-digital converters determine multiple least significant bits.

7. The method of claim 1, further comprising processing a portion of a second bit of the input signal with the SAR analog-to-digital converter, the second bit different from the least significant bit.

8. The method of claim 7, further comprising applying the portion of the second bit in an error correction scheme.

9. A hybrid analog-to-digital converter comprising:

pipeline analog-to-digital converter circuitry comprising:
  analog-to-digital converter circuitry configured to sample an input signal;
  digital-to-analog converter circuitry configured to reconstruct a determined signal portion; and
  a subtractor configured to determine a residual signal portion based on the reconstructed determined signal portion and the input signal; and an interleaved analog-to-digital converter configured to determine a least significant bit, the interleaved analog-to-digital converter comprising:
  a matching circuit configured to adjust a reference signal of the interleaved analog-to-digital converter based on a scale of the analog-to-digital converter circuitry.

10. The hybrid analog-to-digital converter of claim 9, wherein the interleaved converter comprises a successive approximation register analog-to-digital converter.

11. The hybrid analog-to-digital converter of claim 9, wherein the matching circuit comprises a capacitor configured to adjust the reference signal.

12. The hybrid analog-to-digital converter of claim 11, wherein the capacitor comprises a programmable capacitor and the interleaved analog-to-digital converter further comprises circuitry configured to calibrate the programmable capacitor.

13. The hybrid analog-to-digital converter of claim 9, wherein to analog-to-digital converter element is further to determine a portion of a second bit, the portion of the second bit being associated with error correction.

14. A system, comprising:

a pipeline analog-to-digital converter as a first stage to process an input signal; and a successive approximation register (SAR) analog-to-digital converter as a second stage to process the input signal, the SAR analog-to-digital converter including: power adjustment circuitry including a first capacitor characterized by a first capacitance and a second capacitor characterized by a second capacitance, the power adjustment circuitry configured to adjust a reference voltage of the SAR analog-to-digital converter to attempt match a scale voltage of the pipeline analog-to-digital converter responsive to first and second capacitances.

15. The system of claim 14, where the first capacitor comprises a programmable capacitor.

16. The system of claim 14, wherein the pipeline analog-to-digital converter processes a most-significant-bit of the input signal.

17. The system of claim 14, wherein the SAR analog-to-digital converter is configured to process a least-significant bit of the input signal.

18. The system of claim 14, wherein the pipeline analog-to-digital converter is configured to output a sampled input signal to the SAR analog-to-digital converter.

19. The system of claim 14, wherein the reference voltage of the SAR analog-to-digital converter is characterized by a differential voltage between a full-scale voltage and a ground.

20. The system of claim 14, wherein the SAR analog-to-digital converter is configured to:

sample a portion of a bit from the input signal; and apply the portion of the bit to an error correction scheme.

* * * * *